United States Patent [19]

Negami et al.

[11] Patent Number: 5,389,572
[45] Date of Patent: Feb. 14, 1995

[54] PROCESS OF MAKING CHALCOPYRITE STRUCTURE SEMICONDUCTOR FILM

[75] Inventors: Takayuki Negami, Katano; Mikihiko Nishitani, Nara; Shigemi Kohiki, Osaka; Takahiro Wada, Katano, all of Japan

[73] Assignee: Matsushita Electric Industrial Co., Ltd., Osaka, Japan

[21] Appl. No.: 195,948

[22] Filed: Feb. 14, 1994

[30] Foreign Application Priority Data

Feb. 15, 1993 [JP] Japan ................................. 5-025287

[51] Int. Cl.⁶ ........................................... H01L 21/22
[52] U.S. Cl. .......................................... 437/141; 437/5; 437/105; 437/107; 437/174; 136/264; 148/DIG. 153
[58] Field of Search ..................... 136/264; 427/5, 105, 427/107, 141, 174; 148/DIG. 53

[56] References Cited

U.S. PATENT DOCUMENTS 5,078,804  1/1992  Chen et al. ............................... 437/5
5,286,306  2/1994  Menezes ............................... 136/264

Primary Examiner—R. Bruce Breneman
Assistant Examiner—Ramamohan Rao Paladugu
Attorney, Agent, or Firm—Panitch Schwarze Jacobs & Nadel

[57] ABSTRACT

A I-III-VI$_2$ chalcopyrite semiconductor film containing a Group VII element as a dopant, and methods to produce such a chalcopyrite film are provided. The chalcopyrite film of the present invention has stoichiometric composition, and electrical characteristics such as p-n conduction type, carrier concentration and the like are controlled.

11 Claims, 8 Drawing Sheets

PROCESS OF MAKING CHALCOPYRITE STRUCTURE SEMICONDUCTOR FILM

BACKGROUND OF THE INVENTION

1. Field of the Invention

The present invention relates to a chalcopyrite structure semiconductor thin film containing a specific dopant and a process of producing the same.

2. Description of the Related Art

The chalcopyrite structure semiconductor is a material useful for constituting light-emitting devices and solar cells, because its forbidden band can be wide from a visual region to an infrared ray region and it has a large optical absorption coefficient due to the constituent elements. It is indispensable to produce a p-n junction in manufacturing the solar cells or light-emitting devices. For controlling a p-n conduction type of the chalcopyrite thin film, a method of changing the composition ratio between a Group I element and a Group III element or between a Group II element and a Group IV element which are the constituent elements of chalcopyrite compounds has been used conventionally. For example, in the case of $CuInSe_2$ thin film, n-type is formed when the proportion of the Group III element Cu is less than that of the Group I element In, and in the opposite case p-type is formed. In these cases, such problem is encountered that many lattice defects occur due to deviations in the composition ratio. There are also such problems as depositions of excessive components or appearance of an impurity phase other than the chalcopyrite structure. R. Noufi et al., also report that, it is difficult to control a carrier concentration and resistivity by changing the composition ratio (Appl. Phys. Lett., 45 (1984) p. 688). Particularly, most of the chalcopyrite semiconductor thin film which takes the n-type by deviation in the composition ratio shows a high resistance, and thus a low resistance film is not obtainable.

In fabricating the p-n Junction by using the chalcopyrite thin film produced by the prior art, such inconvenience as the lattice defects and depositions of excessive components owing to deviations of composition ratio, or the impurity phase other than the chalcopyrite-structure appears as mentioned before. Thereby, electrical and optical characteristics of the chalcopyrite thin film are deteriorated. Thus, when the devices having the p-n junction are manufactured by using the chalcopyrite thin film produced by the prior art, efficiency of the devices are inferior due to the deterioration of electrical and optical characteristics. For example, by increase of carrier recoupling centers due to the lattice defects and the impurity phase, an open-circuit voltage of the solar cell drops and also a quantum efficiency of semiconductor laser drops.

When an n-type high resistance film is used, in the solar cells a short-circuit current decreases, and in the light-emitting devices a carrier injection efficiency reduces. Thus, a conversion efficiency of the solar cells and a luminous efficiency of the light-emitting devices are deteriorated.

Moreover, in the solar cells, a depletion layer of the p-n Junction must be broaden to convert incident light efficiently into electrical energy. Thus it is necessary to control the carrier concentration.

SUMMARY OF THE INVENTION

The present invention provides a chalcopyrite structure semiconductor film comprising a Group $I-III-VI_2$ chalcopyrite compound containing a Group VII element as a dopant.

The present invention further relates to a process of producing a chalcopyrite thin film, whereby conventionally problems are solved, constituent element composition is in a stoichiometric ratio and electrical characteristics such as p-n conduction types and carrier concentration are controlled.

A first process of producing the chalcopyrite structure semiconductor film of the present invention comprises:

depositing a $I-III-VI_2$ chalcopyrite compound film on a substrate while evaporating onto the substrate a Group VII element, to obtain a $I-III-VI_2$ chalcopyrite compound film containing the Group VII element therein as a dopant.

A second process of producing the chalcopyrite structure semiconductor film of the present invention comprises the steps of:

depositing a $I-III-VI_2$ chalcopyrite compound film on a substrate, and heat treating the deposited chalcopyrite compound film in an atmosphere containing a vapor of a Group VII element or its compound to obtain a $I-III-VI_2$ chalcopyrite compound film containing the Group VII element therein as a dopant.

In a preferred embodiment, the process further comprises the step of heat treating the chalcopyrite compound film containing the Group VII element as a dopant, preferably in an atmosphere containing gas selected from the group consisting hydrogen, nitrogen, oxygen, helium and argon. The preferable temperature of the heat treating lies in the range of from 200° C. to 400° C.

In another preferred embodiment, the process further comprises the step of heat treating the chalcopyrite compound film containing the Group VII element as a dopant in an atmosphere containing a vapor of the Group VII element.

In still another embodiment, the heat treating the deposited chalcopyrite compound film in the atmosphere containing the vapor of the Group VII element or its compound is carried out under a vacuum of $10^{-9}$ Torr to $10^{-2}$ Torr.

A third process of producing the chalcopyrite structure semiconductor film of the present invention comprises the steps of:

depositing a $I-III-VI_2$ chalcopyrite compound film on a substrate, and heat treating the deposited chalcopyrite compound film in an atmosphere containing a gaseous compound of a Group VII element to obtain a chalcopyrite compound film containing the Group VII element therein as a dopant.

A fourth process of producing the chalcopyrite semiconductor film of the present invention comprises the steps of:

depositing a film comprising a Group I element and a Group III element on a substrate, and heat treating the film in an atmosphere containing a vapor of a Group VI element or its gaseous compound and a gaseous compound of a Group VII element to obtain a $I-III-VI_2$ chalcopyrite compound containing the Group VII element as a dopant.

The present invention further provides a solar cell whose absorber layer or heterojunction forming layer comprises a I-III-VI$_2$ chalcopyrite semiconductor film containing a Group VII element as a dopant.

The present invention also provides a light-emitting device whose active layer or clad layer comprises a I-III-VI$_2$ chalcopyrite semiconductor film containing a Group VII element as a dopant.

DETAILED DESCRIPTION OF THE INVENTION

Figure 1:
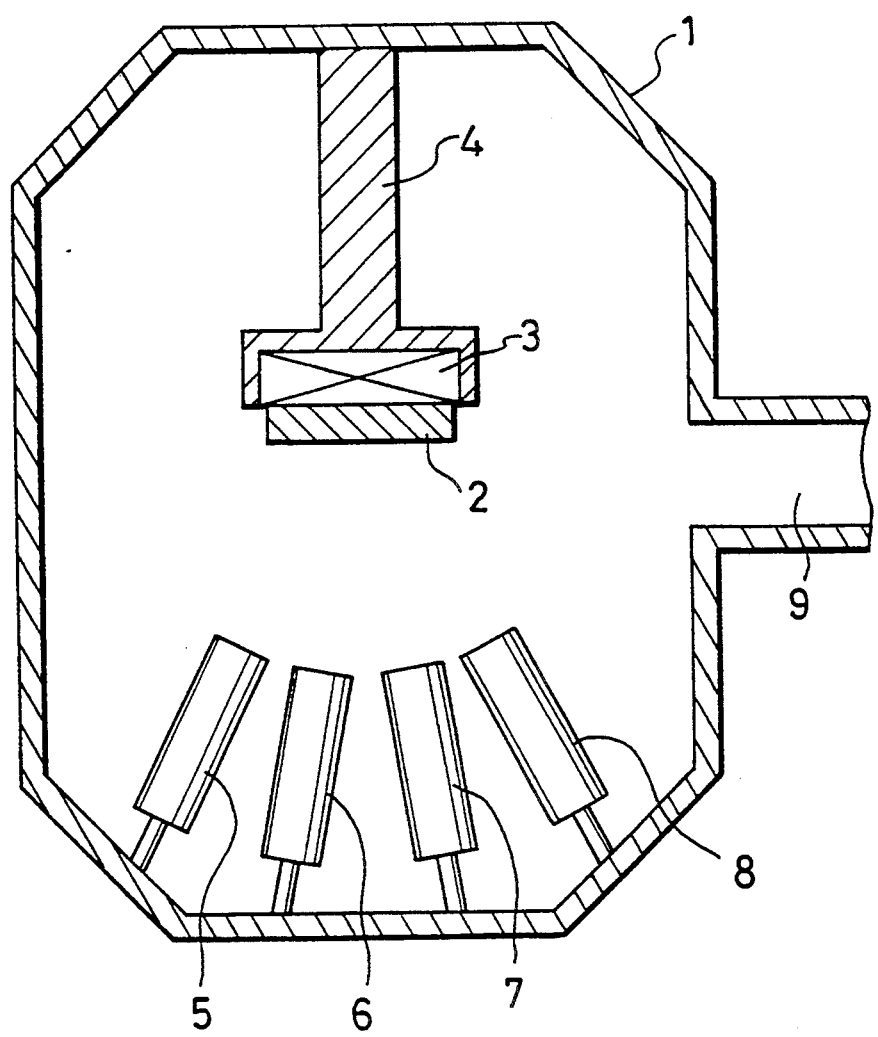
FIG.1 is a longitudinal sectional view showing a schematic configuration of an apparatus for obtaining a I-III-VI$_2$ chalcopyrite structure semiconductor thin film doped with a Group VII element in one embodiment of the present invention.

The present invention is directed to a Group I-III-VI$_2$ chalcopyrite structure semiconductor film containing a Group VII element as a dopant, and to methods for producing the same.

The I-III-VI$_2$ chalcopyrite structure semiconductor thin film of the present invention is that, by containing the Group VII element as a dopant, the composition of constituent elements is in a stoichiometric ratio, and electrical characteristics such as p-n conduction types and carrier concentration are controlled.

According to the first production process of the present invention, by simultaneously evaporating the Group VII element or its compound onto the substrate during depositing the Group I-III-VI$_2$ chalcopyrite structure semiconductor thin film on the substrate by evaporation, sputtering or the like, the Group VI element in the deposited chalcopyrite structure is partly substituted by the Group VII element.

According to the second or third production process of the present invention, by heat treating the deposited I-III-VI$_2$ thin film in an atmosphere containing a vapor of the Group VII element or its compound, or an atmosphere containing a gaseous compound of the Group VII element under a vacuum or a gas atmosphere, the Group VI element in the I-III-VI$_2$ chalcopyrite is substituted by the Group VII element (hereinafter, the second and the third production processes are referred to as "diffusion process").

According to the fourth production process of the present invention, by heat treating a film comprising the Group I and Group III elements in an atmosphere containing a vapor of the Group VII element or its gaseous compound and a gaseous compound of the Group VII element, the Group VII element is taken into the resultant I-III-VI$_2$ chalcopyrite film, and the Group VI element in the film is partly substituted by the Group VII element.

As mentioned above, the I-III-VI$_2$ chalcopyrite structure semiconductor thin film obtained by the present invention becomes a semiconductor film showing an n-type conduction in the presence of excessive electrons caused by partial substitution of the Group VI element by the Group VII element.

A ratio of the element (dopant) substituted partly as aforementioned against the main element is very small usually 0.1 atomic % or less, and therefore, the composition ratio of the resultant chalcopyrite thin film can be kept in a stoichiometric ratio. Thus, there is no appearance of lattice defects and excessive component depositions due to the deviation of composition ratio nor appearance of an impurity phase other than the chalcopyrite structure. Also, in such production processes, by controlling the evaporating velocity of the Group VII element as the dopant or its compound, or a flow rate of gaseous compound of the Group VII element, a carrier concentration or resistivity of the resultant film can be controlled. Thus, a degree of freedom on designing the solar cells or light-emitting devices increases, and the desired carrier concentrations or the like necessary for the devices can be obtained easily.

Since the substitution takes place from the surface of the chalcopyrite thin film when substituting the dopant and the main element by using the diffusion process, the Group VII element tends to concentrate near the surface, and the concentration inside the film becomes gradually thinner as depth increases. When such distribution has occurred, for example, in the solar cells, an internal electric field is produced in the n-type semiconductor film, and minority carriers (in this case, positive holes) produced near the surface are accelerated inwardly or to the p-n junction interface from the film surface. Therefore, carrier recouplings in the n-type film decrease and a large amount of electric current can be obtained.

Moreover, by the heat treatment of the n-type chalcopyrite thin film obtained by the aforementioned process, an activation factor of the dopant being substituted (an amount of applied electron against an amount of dopant being substituted) can be improved. That is, a low resistance n-type film can be obtained with a little amount of dopant, and deterioration of crystalline quality such as disturbance of the chalcopyrite structure due to excessive impurities is eliminated. Moreover, the n-type chalcopyrite film formed by the diffusion process can be used in a process of optimizing the efficiency of devices such as the solar cells, because a distribution form of the dopant can be controlled by the heat treatment temperature and time.

Since the n-type chalcopyrite thin film obtained by the aforementioned process has little lattice defects and deposition of excessive components or an impurity phase, the carrier recoupling center decreases, and thus it can realize solar cells having a high conversion efficiency and the light-emitting devices having a high luminous efficiency.

The range of appropriate temperature for heat treatment in the third process or the fourth process of producing the chalcopyrite structure semiconductor film is between 300 °C. and 600 °C. Although the temperature of heat treatment for the chalcopyrite structure films may differ depending on their constituent elements, a film of high quality is not expected to be obtained with heat treatment at a temperature lower than 300 °C. And, when heat treatment is made at a temperature higher than 600° C., the film composition changes owing to desorption of a Group VI element, or Group III and VI elements from a film.

The Group I element which is applicable to the present invention is, for instance, Cu or Ag.

The Group III element which is applicable to the present invention is, for instance, Al, Ga or In.

The Group VI element which is applicable to the present invention is, for instance, S, Se or Te. Further, as the gaseous compound of the Group VI element which is applicable to the present invention, for instance, $H_2S$, $CS_2$, $H_2Se$, $(CH_3)_2Se$, $(C_2H_5)_2Se$ or the like may be exemplified.

The Group VII element which is applicable to the present invention is, for instance, F, Cl or Br. Further, as the gaseous compound of the Group VII element, for instance, HCl, HF or the like may be exemplified.

In the following, the embodiments of the present invention are described with reference to the drawings.

Embodiment 1

FIG.1 shows a schematic configuration of an apparatus for obtaining a chalcopyrite structure semiconductor thin film.

In a vacuum container 1, a support 4 is disposed holding a substrate 2 for depositing a chalcopyrite thin film thereon and including heater 3 for heating the substrate 2. Moreover, in the container 1, a source 5 of Cu, a source 6 of In and a source 7 of Se, which are main constituent elements of chalcopyrite compound $CuInSe_2$, and a source 8 of a dopant including $InCl_3$ are provided.

An opening 9 is connected to an exhaust system. Source crucibles of Cu, In and Se were heated in vacuum of about $10^{-7}$ Torr respectively at 1140° C., 860° C. and 200° C. to evaporate the elements, and simultaneously, Cl was evaporated from the source of $InCl_3$ to deposit a $CuInSe_2$:Cl (CIS:Cl) film on the substrate. Hereinafter, this production process is referred to as "simultaneous evaporating process". Hereupon, when $InCl_3$ is heated, $InCl_3$ is decomposed and only Cl is evaporated at the temperature of about 300° C. or less. A glass plate partly covered by a ZnO film and an Au film was used as the substrate.

Figure 2:
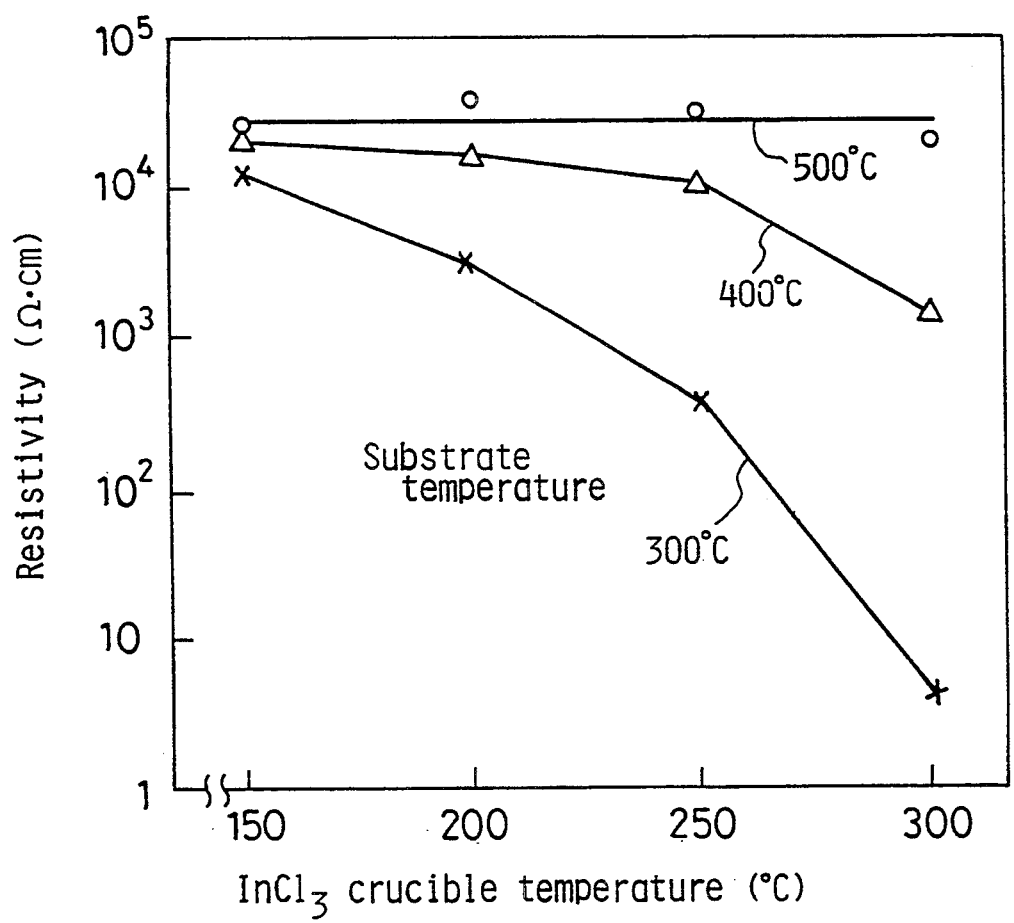
FIG.2 shows the relationship between a substrate temperature, a InCl$_3$ crucible temperature and resistivity of a CIS:Cl film obtained in embodiment 1 of the present invention.

FIG.2 shows the relationship between the substrate temperature during film forming, $InCl_3$ crucible temperature and resistivity of the resultant CIS:Cl film. Hereupon, the higher the $InCl_3$ crucible temperature is, the faster is the evaporating velocity of Cl or the greater the deposition quantity to the substrate. A composition ratio Cu/In of the resultant film is within a range of from 0.95 to 1.00, and Se/(Cu+In) is within a range of from 1 to 1.02, and thus a stoichiometric composition ratio (Cu:In:Se=1:1:2) is substantially satisfied. All of the resultant films were the n-type. When forming the film at the substrate temperature of 500° C., regardless of the $InCl_3$ crucible temperature, the resistivity of the resultant film was $10^4$ Ωcm or more. Since the resistivity of a $CuInSe_2$ (CIS) film of stoichiometric composition ratio without Cl is about $10^5$ to $10^4$ Ωcm, when forming the film at the substrate temperature of 500° C. it is understood that Cl hardly goes into the film. When forming the film at the substrate temperature of 400°, the film resistivity drops to $10^3$ Ωcm when the $InCl_3$ crucible temperature is kept at 300° C. On the contrary, when forming the film at the substrate temperature of 300° C., the film resistivity drops abruptly as the $InCl_3$ crucible temperature rises.

From the above facts, it is understood that Cl is effectively taken into the film at the substrate temperature of about 300° C. during film forming. When forming the film at the substrate temperature of 300° C., the film resistivity or the carrier concentration can be controlled by the $InCl_3$ crucible temperature. However, as a result of X-ray diffraction, it is understood, that, when forming the film on the glass and the Au film, the CIS:Cl film produced at the substrate temperature of 400° C. or higher forms a chalcopyrite structure, while the film produced at the substrate temperature of 300° C. does not form the chalcopyrite structure. Thus, this process is not suitable for forming the film on amorphous substrates such as glass plates and metal films. However, similarly from an X-ray diffraction pattern, it is confirmed that, the chalcopyrite structure is formed not only in the case of substrate temperature of 400° C. or higher, but even in the case of substrate temperature of 300° C., when forming the film on a ZnO film. Thus, a validity of this production process is dependent on the substrate being used, and therefore, this point should be noted.

The preferable substrate is of a material having polycrystal structure, and amorphous materials or metals are not suitable. A semiconductor of a Group VI, e.g., Si, a Group III-VI compound, e.g., CdS or an oxide, e.g., ITO (indium tin oxide), $SnO_2$ or $Al_2O_3$ is suitable for the substrate.

Embodiment 2

Description will be made on an example of production process, whereby the group VI element in the film is substituted by the group VII element, by heating the film while evaporating the group VII element thereabout after depositing a $I-III-VI_2$ chalcopyrite thin film. Hereinafter, this process is referred to as "vapor-phase diffusion process".

Using the same vacuum container as shown in FIG. 1, Cu, In and Se are heated to the same temperature as the aforementioned embodiment to produce a CIS film at the substrate temperature of 500° C. Then, the substrate temperature is fixed within a range of 200° to 400° C. while evaporating $InCl_3$ from the source in vacuum about $10^{-7}$ Torr to heat the CIS film.

Figure 3:
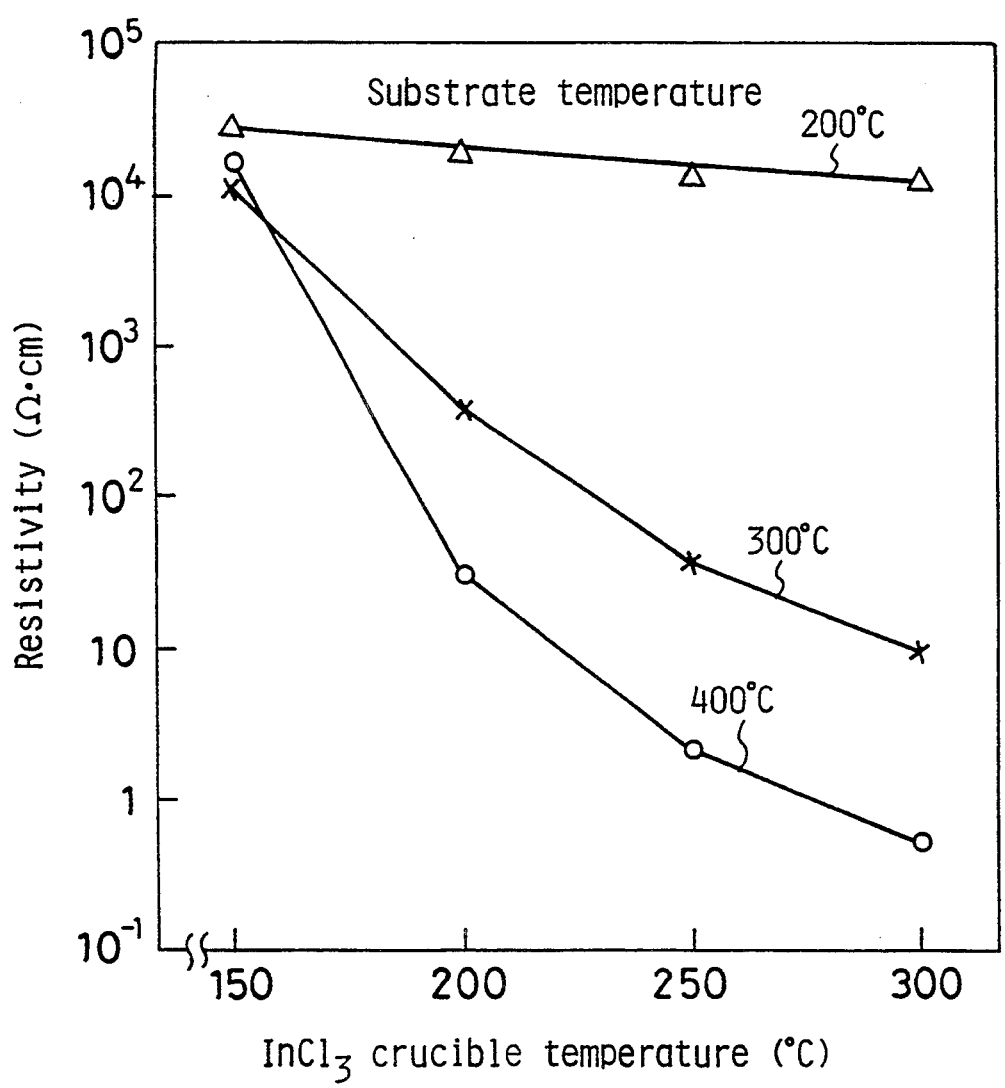
FIG.3 shows the relationship between a substrate temperature, a InCl$_3$ crucible temperature at the time of heat treating a CIS film and resistivity of a resultant CIS:Cl film in embodiment 2.

FIG.3 shows the relationship between the substrate temperature, $InCl_3$ crucible temperature and resistivity of the heat treated film. Hereupon, the heat treatment time is fixed at 30 minutes. Compositions of all of the heat treated films substantially satisfy the stoichiometric composition ratio, and show the n-type conduction. When the substrate temperature is 200° C., the change of film resistivity is little against changes in the $InCl_3$ crucible temperatures, and at the $InCl_3$ crucible temperature of 150° C. it is not so much different from the resistivity of about $10^4$ Ωcm of the CIS film without Cl. When the substrate temperature is 300° C., the resistivity drops abruptly as the $InCl_3$ crucible temperature rises, and at the $InCl_3$ crucible temperature of 300° C., the resistivity drops to about 10 Ωcm. This value is lower by three digits than the resistivity of the CIS film without Cl. From this fact, it is understood that the resistivity can be controlled by the $InCl_3$ crucible temperature.

The temperature range of the substrate for rendering favorable results is 300 ° C. to 500 ° C.

Embodiment 3

Description will be made on an example of production process, whereby the group VI element in the film is substituted by the group VII element, by heating the $I-III-VI_2$ chalcopyrite thin film in a gaseous atmosphere containing the group element after being deposited on the substrate. Hereinafter, this process is referred to as "gas heat treatment process".

Figure 4:
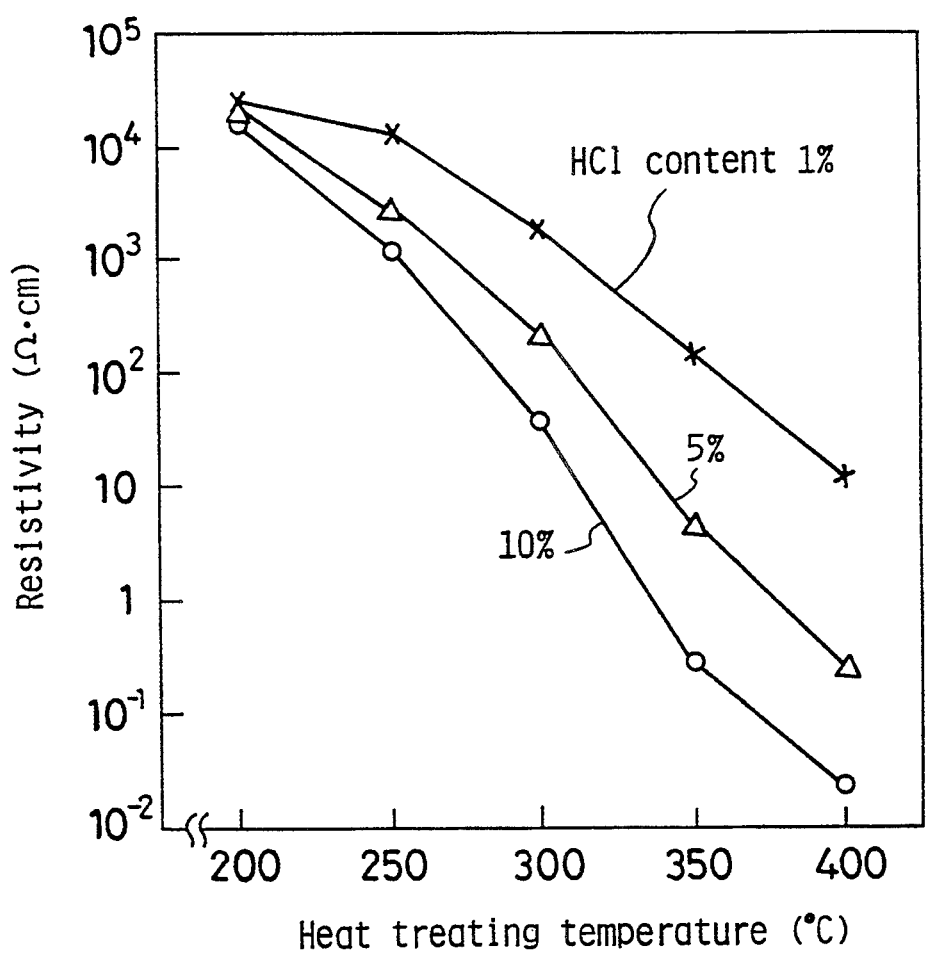
FIG.4 shows the relationship between a HCl content in an atmosphere, a heat treatment temperature at the time of heat treating a CIS film and resistivity of a resultant CIS:Cl film in embodiment 3.

The CIS film produced at the substrate temperature of 500° C. by the same process as the aforementioned embodiment was fed into a quartz tube, and heated while mixed gas of HCl and $N_2$ was being introduced to the quartz tube. A flow rate of the mixed gas was 200 ml/min., and the heat treatment time was one hour. FIG.4 shows the relationship between the HCl gas content in the mixed gas, heat treatment temperature and resistivity of the heat treated CIS film. Hereupon, all of the resultant films show n-type. Regardless of the HCl content, the film resistivity drops as the heat treatment temperature rises. Particularly, when the HCl content is 10 vol. % and the heat treatment temperature is 400° C., the film resistivity drops to about $10^{-2}$ Ωcm. This value is lower than the resistivity before the heat treatment by about 6 digits. However, the film surface heated at the HCl content of 10 vol. % at 350° C. or higher was uneven and rough. This is believed that, by using the mixed gas of high HCl content at the high heat treatment temperature, the film surface is etched by or reacted with HCl. From X-ray diffraction, it is understood that a crystalline quality evaluated by a half width of a 112 diffraction peak of the chalcopyrite structure CIS film is considerably worse as compared with the film before the heat treatment. On the contrary, by the heat treatment using gas having the HCl content of 5 vol. % or less, roughness of the film surface and the deterioration of crystalline quality were not observed regardless of the heat treatment temperature. It is understood from the figure that, when comparing the HCl contents of 5 vol. % and 1 vol. %, the resistivity drops at respective heat treatment temperature as the HCl content increases. Thereby, it is understood that, the film resistivity can be controlled by the heat treatment temperature and the HCl content in the mixed gas. Though the above-mentioned embodiment shows the case of using $N_2$ as dilution gas of HCl, the same result were obtained by using $H_2$, He and Ar.

Figure 5:
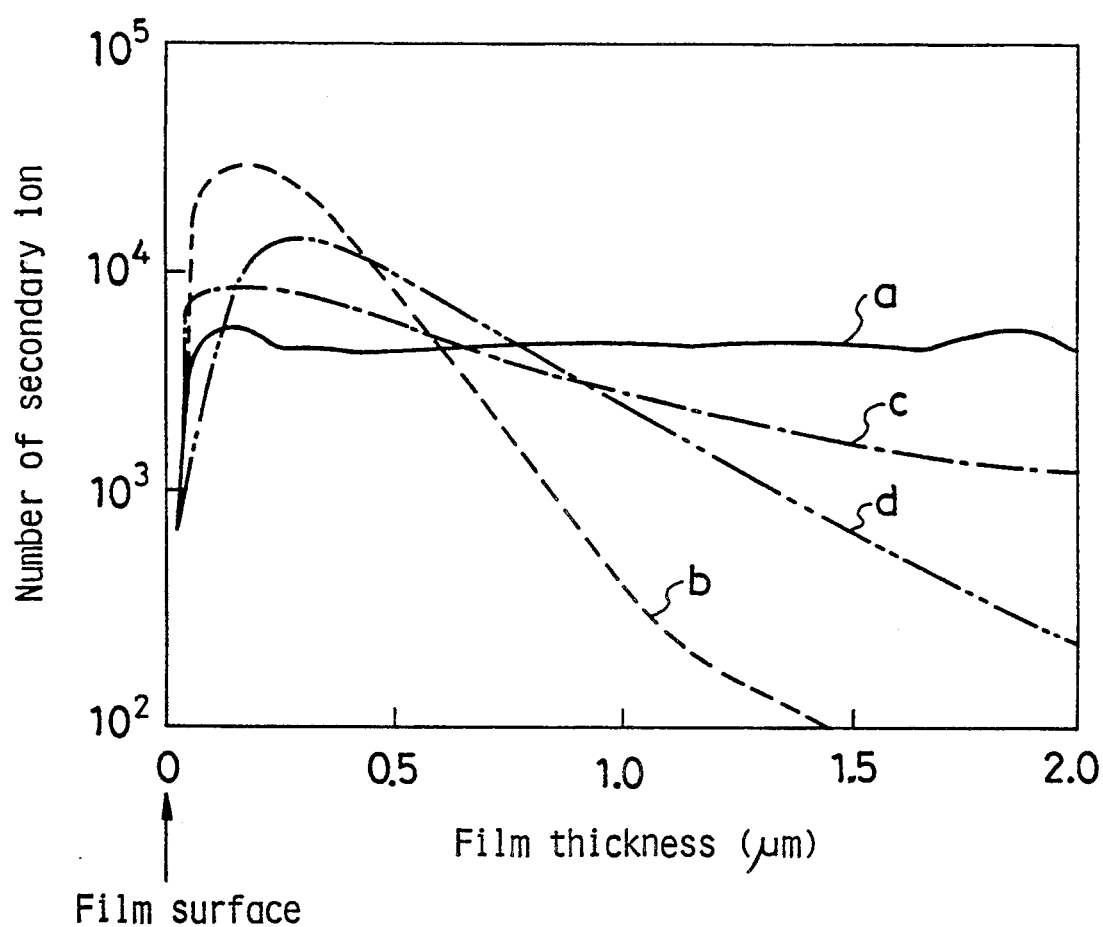
FIG.5 shows distributions of Cl element in a CIS:Cl film obtained in embodiments 1 to 4.

FIG.5 shows results of testing distributions of Cl elements in the CIS:Cl film produced in the aforementioned embodiments by a secondary ion mass analysis. A curve "a" shows the Cl distribution of the CIS:Cl film produced by the simultaneous evaporating process, a curve "b" shows that by the vapor-phase diffusion process and a curve "c" shows that by the gas heat treatment process. A curve "d" is to be described later. The results shown are tested (i) on the films produced at the substrate temperature of 300° C. and the $InCl_3$ crucible temperature of 250° C. for the simultaneous evaporating process, (ii) on the films heated at the substrate temperature of 300° C. and the $InCl_3$ crucible temperature of 250° C. for 30 minutes for the vapor-phase diffusion process, and (iii) on the film heated at 300° C. in mixed gas having the HCl content of 5 vol. % for the gas heat treatment process. It is understood that, in the simultaneous evaporating process Cl is distributed equally in the film. In the vapor-phase diffusion process and gas heat treatment process, Cl is distributed mostly near the film surface and decreases as approaching the substrate. When comparing the Cl distribution in the film in the vapor-phase diffusion process and gas heat treatment process, the latter is smaller. Thereby, a production process to be adopted can be selected by the configuration or design of the devices to be produced.

Embodiment 4

Description will be made on the result of heating the CIS:Cl film produced by the simultaneous evaporating process or vapor-phase diffusion process in an Ar atmosphere at 400° C. for 30 minutes. Hereinafter, this is referred to as "after heat treatment".

In the case of simultaneous evaporating process, the film produced at the substrate temperature of 400° C. or higher has no change in resistivity before and after the after heat treatment. On the contrary, the resistivity of the film produced at the substrate temperature of 300° C. and $InCl_3$ crucible temperature of 200° C. or higher is lower than those before the after heat treatment by one digit. This reason is believed that, substitution takes place from dislocated Cl having entered between lattices to Se forming the crystal structure, and an amount of Cl supplying electrons has increased (increase in activation rate). In the film produced by the vapor-phase diffusion process, the resistivity of the film heated at the substrate temperature of 200° C. increased by the after heat treatment, and the resistivity of the film heated at 300° C. or higher decreased by about one digit. This is believed that, in the film heated at the substrate temperature of 200° C., Cl near the film surface has diffused in the film and is diluted by the after heat treatment. On the contrary, it is believed that, in the film produced at the substrate temperature of 300° C. or higher, though Cl near the film surface diffuses by the after heat treatment the activation factor increases furthermore. The curve "d" in FIG.5 shows the Cl distribution of the film obtained by the vapor-phase diffusion process and heated at the substrate temperature of 300° C. and $InCl_3$ crucible temperature of 250° C. for 30 minutes, after the heat treatment in the Ar atmosphere at 400° C. for 30 minutes. It is understood that, Cl is distributed equally in the film as compared with the film which is not subjected to the after heat treatment and shown by the broken line.

Although the chalcopyrite compound film is deposited by three-source evaporation in the above-mentioned embodiments, another preferable deposition method, for example, sputtering or selenization of Cu/In layers in $H_2Se$ atmosphere may be employed in the present invention.

Additionally, the following is a brief explanation for the phrase "after heat treatment". The appropriate temperature for heat treatment is between 200° C. and 600° C. The heat treating time even at the lowest temperature is shorter than 5 hours. As the temperature increases, the treating time becomes shorter. As stated above, such after heat treatment will render activation of the dopant or controlled distribution of the dopant.

Embodiment 5

A production process will be described for the fifth embodiment wherein a laminated film of Group I element and Group III element, or a thin film containing the Group I element and Group III element is heated in an atmosphere, containing a gaseous compound of the Group VII element and a vapor of Group VI element. Hereinafter, this process is referred to as "solid-phase selenization process".

Figure 6:
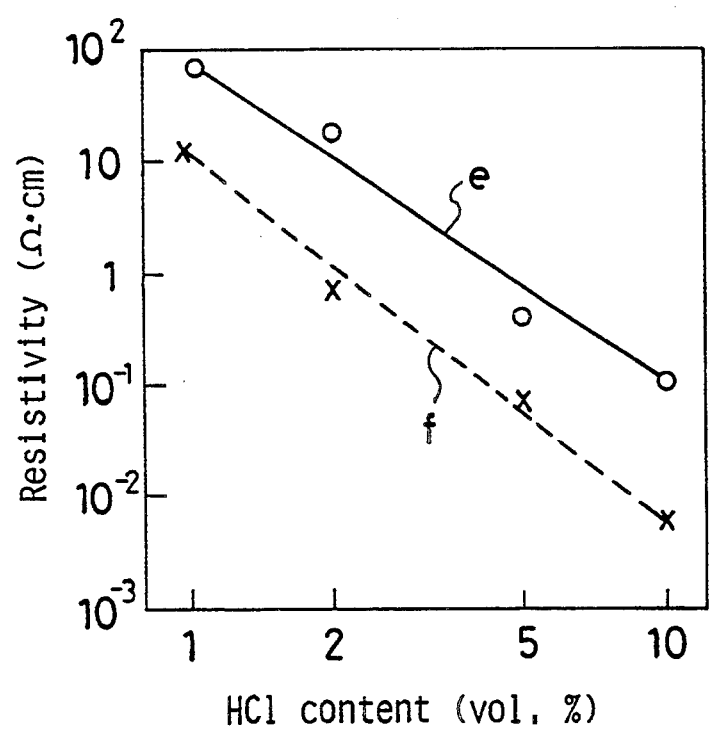
FIG.6 shows the relationship between a HCl content in an atmosphere at the time of obtaining the CIS:Cl film and resistivity of a resultant CIS:Cl film in embodiments 5 and 6.

First, a Cu film was deposited by sputtering on a glass substrate at the thickness of about 0.2 μm. Then, an In film was deposited on the Cu film by sputtering at the thickness of about 0.45 μm. The laminated film and Se powder are fed into a quartz tube, into which mixed gas of HCl gas and $N_2$ gas is introduced to produce a CIS film by heating with a heater provided around the quartz tube. The curve "d" in FIG.6 shows the relationship between the HCl gas content in the mixed gas and the resistivity of the resultant CIS film. The heat treatment temperature is 450° C. and the time is 4 hours. The resistivity of the film decreases as the HCl gas content increases. This is believed that, as the heat treatment temperature rises, an amount of Cl taken into the film increases and the Cl in the film is activated. Thereby, it is understood that the resistivity can be controlled by the HCl gas content.

Embodiment 6

A production process, whereby a laminated film of the Group I element and Group III element or a thin film containing the Group I element and group III element is heated in an atmosphere containing a gaseous compound of the Group VII element and a gaseous compound of the Group VII element, is described. Hereinafter, this process is referred to as "vapor-phase selenization process".

First, Cu and In are deposited simultaneously on a glass substrate to produce a mixed Cu-In film or Cu-In alloy film. Composition ratio of Cu and In of the film is about 1:1. Then, the mixed film was fed into a quartz tube and heat treated in mixed gas of HCl gas, $H_2Se$ gas and $N_2$ gas to obtain a CIS film. A broken line curve "f" in FIG.6 shows the relationship between the HCl gas content in the mixed gas and the resistivity of the resultant CIS film. The ratio of mixed gases except HCl gas is fixed at 10% $H_2Se$ and 90% $N_2$. The heat treatment temperature is 450° C. and the time is 4 hours. The film resistivity decreases as the HCl gas content increases. However, it is understood from an X-ray diffraction pattern that the resultant film does not form a chalcopyrite structure at the HCl gas content of 10% or more. This is believed that reactions between $H_2Se$ and a Cu-In film is suppressed as HCl increases. When comparing the solid-phase selenization process shown by the solid line curve "e" and the vapor-phase selenization process shown by the broken line curve "f", resistivities of the resultant film at respective HCl gas contents are lower in case of the vapor-phase selenization process, and the resistivity decreases abruptly as the HCl gas content increases. Reason of this is believed that, contrary to solid-phase reactions between a metal film and a solid Se in the solid-phase selenization process, Cl in gaseous HCl is easily taken into the film, since the CIS film is formed by vapor-phase reactions between the metal film and $H_2Se$ in the vapor-phase selenization process.

Embodiment 7

Elucidation will be made on a validity of the present invention on the chalcopyrite structure semiconductor film other than the CIS film. As same as the embodiment 6, a mixed Cu-In film was fed into a quartz tube, into which mixed gas of $H_2S$, HCl and $N_2$ was introduced to produce $CuInS_2$ by heat treatment. The heat treatment is performed at 500° C. for 4 hours in the mixed gas having a fixed ratio of 10% $H_2S$ and 90% $N_2$ except HCl gas. When a $CuInS_2$:Cl film was produced by changing the HCl content from 1% to 10% the resistivity of the resultant film changed from $10^2$ Ωcm to $10^2$ Ωcm, accordingly. Thus, it is understood that, the resistivity of the film can be controlled by changing the HCl gas content. In this case, it is confirmed that, a chalcopyrite structure is formed till the HCl gas content reaches 10%.

Embodiment 8

Evaporating source crucibles containing Cu, Al, Se and CuCl were respectively heated at 1140° C., 1200° C., 200° C. and 400° C.; and a $CuAlSe_2$:Cl film was deposited on GaAs crystals having (100) face at the substrate temperature of 600° C. The resultant film was n-type and its resistivity was 1 Ωcm. Since the $CuAlSe_2$ film obtained without evaporating CuCl was p-type, it is understood that, the conduction type can be controlled by doping Cl. Meanwhile, when this film was heat treated in an Ar atmosphere at 500° C. for 3 hours, the film resistivity dropped to $10^2$ Ωcm.

Embodiment 9

Figure 7:
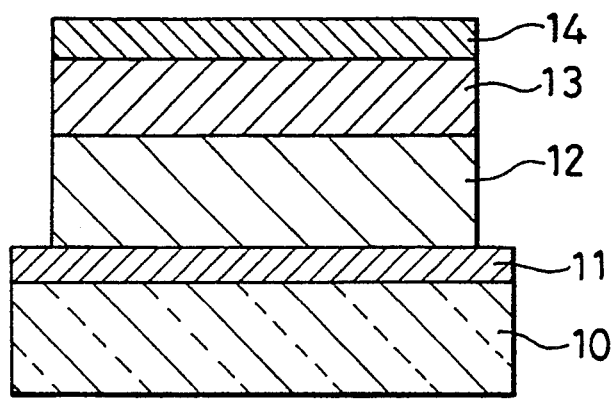
FIG.7 is a longitudinal sectional view showing an example of configuration of a solar cell device using a I-III-VI$_2$ film according to the present invention.

In the following, solar cells and light-emitting devices manufactured by using these processes will be described. FIG.7 shows one embodiment of the solar cell manufactured by using the present invention.

Figure 8:
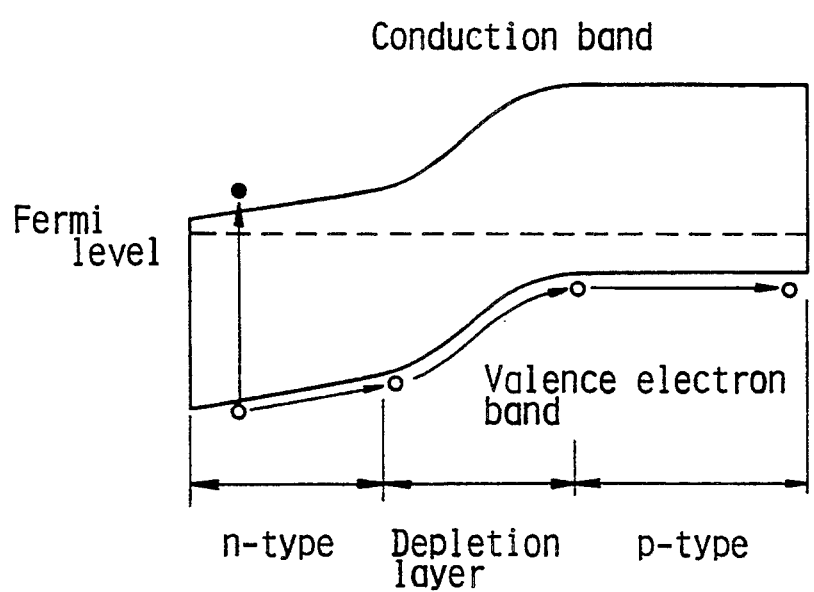
FIG.8 shows a band configuration of the device.

A p-type $CuInSe_2$ (CIS) thin film 12 is formed in a predetermined area on a Mo thin film 11 deposited on a glass substrate 10. As a process of producing the p-type CIS film 12, a process of depositing the 2-layer CIS film having different composition ratios of Cu and In or a process of depositing the CIS film while irradiating a nitrogen ion are suitable. Next, in vacuum of about $10^{-7}$ Torr, fixing the substrate temperature of the p-type CIS film at about 300° C., evaporation is carried out for $InCl_3$ and substituting Se by Cl in the CIS film surface to form an n-type CIS:Cl film 13. Moreover, heat treatment is performed in an Ar or $N_2$ atmosphere at 300° C. for about 30 minutes. Optimum condition of the heat treatment is dependent on an evaporation (, hence substitution) amount of $InCl_3$ and a carrier concentration of the p-type CIS film. Therefore, the atmosphere gas, heat treatment temperature or time are to be selected suitably case by case. The heat treatment may sometimes not be necessary depending on the carrier concentration or thickness of the p-type CIS film. On the p-n homojunction CIS film 13 formed by the above-mentioned process, a ZnO (ZnO:Al) film mixed with 1 wt. % Al is formed as a transparent electrode 14. FIG.8 shows a band structure of the device. In the n-type CIS film, as a result of diffusion of Cl from the CIS film surface, the surface is in an n-type low resistance structure, or a structure wherein a Fermi level is present near a conduction band of the CIS film and gradually approaches to a valence electron band. In the case of such band structure, since an internal electric field is produced also in the n-type CIS film, minority carriers (in this case, positive holes) produced near the film surface by luminous irradiation will be accelerated towards a depletion layer. In the case of usual p-n junction, since the minority carriers near the film surface which are going to recouple can also be taken out, the resultant current amount increases. Therefore, a high efficiency can be realized. Meanwhile, an n-type CdS film was deposited by an evaporation method on a high resistance n-type CIS:Cl film formed near the p-type CIS film surface having a reduced Cl doping amount, and a ZnO:Al film was deposited thereon to manufacture the solar cell. In this configuration, the internal electric field is produced gently in the whole high-resistance n-type CIS:Cl film disposed between the n-type CdS film and the p-type CIS film. Therefore, the carriers produced in the n-type CIS:Cl layer will be accelerated and taken out from the electrode. By optimizing the film thickness of the CIS:Cl layer by an optical absorption coefficient of the CIS film and carrier densities of the p-type CIS film and n-type CdS film, the carrier recouplings can be reduced, and accordingly the carriers produced by luminous irradiation can be taken out efficiently. Thus a higher efficiency of the solar cell is achievable.

Embodiment 10

Figure 9:
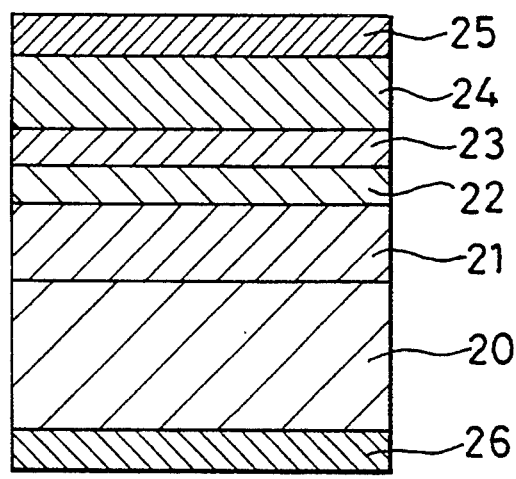
FIG.9 is a longitudinal sectional view showing an example of configuration of a light-emitting device using a I-III-VI$_2$ film according to the present invention.

FIG.9 shows one embodiment of a visual range light-emitting device manufactured by using the present invention. A low resistance p-type $CuAlSe_2$ film 21 is formed on a GaAs substrate 20, and a high-resistance p-type $CuAlSe_2$ film 22 is formed thereon. Cu, Al, Se and CuCl are evaporated simultaneously on the high-resistance p-type $CuAlSe_2$ film 22 to form a high-resistance n-type $CuASe_2$:Cl film 28. Meanwhile, an evaporation amount of CuCl is increased to form a low-resistance n-type $CuAlSe_2$ film 24. Finally, electrodes 25, 26 consisting of Al or Au are disposed. A blue light emission is obtained by injecting the carriers into the p-n junction. At this time, since the carriers are injected from the low-resistance $CuAlSe_2$:Cl film 24, they can be injected efficiently. Thus, a luminous efficiency can be improved.

What is claimed is:

1. A process of producing a chalcopyrite semiconductor film comprising:
   depositing a Group $I\text{-}III\text{-}VI_2$ chalcopyrite compound film on a substrate while evaporating onto said substrate a Group VII element to obtain a $I\text{-}III\text{-}VI_2$ chalcopyrite compound film containing said Group VII element therein as a dopant.

2. A process of producing a chalcopyrite semiconductor film comprising the steps of:
   depositing a Group $I\text{-}III\text{-}VI_2$ chalcopyrite compound film on a substrate, and
   heat treating said chalcopyrite compound film in an atmosphere containing a vapor of a Group VII element or its compound to obtain a $I\text{-}III\text{-}VI_2$ chalcopyrite compound film containing said Group VII element as a dopant.

3. The process in accordance with claim 2 wherein said heat treating is carried out under a vacuum of $10^{-9}$ Torr to $10^{-2}$ Torr.

4. The process in accordance with claim 1 which further comprises the step of heat treating said chalcopyrite compound film.

5. The process in accordance with claim 2 which further comprises the second step of heat treating said chalcopyrite compound film.

6. The process in accordance with claim 4 wherein said step of heat treating is carried out in an atmosphere containing at least one member selected from the group consisting hydrogen, nitrogen, oxygen, helium and argon.

7. The process in accordance with claim 5 wherein said second step of heat treating is carried out in an atmosphere containing at least one member selected from the group consisting hydrogen, nitrogen, oxygen, helium and argon.

8. The process in accordance with claim 4 wherein said step of heat treating is carried out in an atmosphere containing a vapor of the Group VI element.

9. The process in accordance with claim 5 wherein said second step of heat treating is carried out in an atmosphere containing a vapor of the Group VI element.

10. A process of producing a chalcopyrite semiconductor film comprising the steps of:
    depositing a Group $I\text{-}III\text{-}VI_2$ chalcopyrite compound film on a substrate, and
    heat treating the deposited chalcopyrite compound film in an atmosphere containing a gaseous compound of a Group VII element to obtain a chalcopyrite compound film containing said Group VII element therein as a dopant.

11. A process of producing a chalcopyrite semiconductor film comprising the steps of:
    depositing a film comprising a Group I element and a Group VII element on a substrate, and
    heat treating said film in an atmosphere containing a vapor of a Group VII element or its gaseous compound and a gaseous compound of a Group VII element to obtain a $I\text{-}III\text{-}VI_2$ chalcopyrite compound containing the Group VII element as a dopant.

* * * * *